United States Patent
Racz et al.

(10) Patent No.: US 10,290,554 B2
(45) Date of Patent: May 14, 2019

(54) CURRENT SENSOR AND METHOD OF MAKING A CURRENT SENSOR

(71) Applicant: Melexis Technologies SA, Bevaix (CH)

(72) Inventors: Robert Racz, Zug (CH); Bruno Boury, Kontich (BE); Antonino Cacciato, Heverlee (BE); Jian Chen, Heist op den Berg (BE); Guido Dupont, Bevaix (CH)

(73) Assignee: Melexis Technologies SA (CH)

( * ) Notice: Subject to any disclaimer, the term of this patent is extended or adjusted under 35 U.S.C. 154(b) by 220 days.

(21) Appl. No.: 15/376,584

(22) Filed: Dec. 12, 2016

(65) Prior Publication Data

US 2018/0166350 A1    Jun. 14, 2018

(51) Int. Cl.
    *H01L 21/66*    (2006.01)
    *H01L 23/48*    (2006.01)
    (Continued)

(52) U.S. Cl.
    CPC ............ *H01L 22/32* (2013.01); *G01R 15/207* (2013.01); *H01L 21/4825* (2013.01);
    (Continued)

(58) Field of Classification Search
    CPC .. G01R 15/202; G01R 15/205; G01R 15/207; H01L 23/3114; H01L 23/481; H01L 23/49503; H01L 23/4952; H01L 23/552
    See application file for complete search history.

(56) References Cited

U.S. PATENT DOCUMENTS

| 7,129,691 | B2 | 10/2006 | Shibahara et al. |
| 8,283,742 | B2 | 10/2012 | Motz et al. |
| (Continued) | | | |

FOREIGN PATENT DOCUMENTS

| JP | 2002-107382 A | 4/2002 |
| WO | 2005/026749 A1 | 3/2005 |
| WO | 2006/130393 A1 | 12/2006 |
| WO | 2016164265 A1 | 10/2016 |

OTHER PUBLICATIONS

European Search Report and Annex thereto for EPO Application EP17205080 dated May 2, 2018.

*Primary Examiner* — Ermias T Woldegeorgis
(74) *Attorney, Agent, or Firm* — CanaanLaw, P.C.; David B. Ritchie

(57) ABSTRACT

A current sensor comprises a current conductor having a first portion, a measuring portion and a second portion, the first portion including one or more first electrical terminals and the second portion including one or more second electrical terminals. The current sensor further comprises third electrical terminals and a semiconductor chip. The semiconductor chip has one or more magnetic field sensors disposed in the active surface, is mounted on the current conductor with an active surface facing the current conductor. The active surface comprises first contacts. The semiconductor chip comprises electrical through silicon connections disposed over and electrically connected to the first contacts. A backside of the semiconductor chip comprises second contacts, each of the second contacts electrically connected to one of the electrical through silicon connections. Wire bonds electrically connect the second contacts with the third electrical terminals.

14 Claims, 4 Drawing Sheets

(51) Int. Cl.
    *H01L 23/495* (2006.01)
    *H01L 23/31* (2006.01)
    *H01L 21/768* (2006.01)
    *H01L 21/48* (2006.01)
    *H01L 21/56* (2006.01)
    *H01L 23/552* (2006.01)
    *G01R 15/20* (2006.01)

(52) U.S. Cl.
    CPC ........ *H01L 21/4842* (2013.01); *H01L 21/565* (2013.01); *H01L 21/76898* (2013.01); *H01L 23/3114* (2013.01); *H01L 23/481* (2013.01); *H01L 23/4952* (2013.01); *H01L 23/49503* (2013.01); *H01L 23/49541* (2013.01); *H01L 23/552* (2013.01); *H01L 2224/05554* (2013.01); *H01L 2224/48091* (2013.01); *H01L 2224/48247* (2013.01); *H01L 2224/49171* (2013.01); *H01L 2224/73265* (2013.01); *H01L 2924/181* (2013.01)

(56) References Cited

U.S. PATENT DOCUMENTS

| | | |
|---|---|---|
| 2010/0156394 A1* | 6/2010 | Ausserlechner ..... G01R 15/202 324/144 |
| 2012/0049304 A1 | 3/2012 | Motz et al. |
| 2012/0181640 A1 | 7/2012 | Von Koblinski et al. |
| 2014/0167749 A1 | 6/2014 | Kim et al. |
| 2014/0253103 A1 | 9/2014 | Racz et al. |
| 2015/0015249 A1 | 1/2015 | Ausserlechner et al. |

* cited by examiner

CURRENT SENSOR AND METHOD OF MAKING A CURRENT SENSOR

FIELD OF THE INVENTION

The invention concerns a current sensor which is packed in an IC housing (IC=integrated circuit) and which has an integrated current conductor, through which a current to be measured flows. This invention further concerns a method of making such a current sensor.

BACKGROUND OF THE INVENTION

Current conductors are available in many configurations and variants. Current sensors, which detect the magnetic field generated by the current, are packed in a conventional IC housing, and in which the current conductor through which the current to be measured flows is guided through the housing, are known for example from U.S. Pat. No. 7,129,691, WO 2005026749, WO 2006130393 and US 2010156394. Such current sensors contain a current conductor which is arranged as a part of a leadframe, which is used for mounting and producing the electrical terminals, and a semiconductor chip mounted on the leadframe, which semiconductor chip comprises at least one magnetic field sensor and the electronics required for its operation and for processing its output signal.

Today's current sensors have to fulfill many requirements, especially high sensitivity, immunity to temperature variations and stress, high dielectric strength of typically 2 to 4 kV between the current conductor and the electronics and finally low production costs.

DISCLOSURE OF THE INVENTION

The object of the invention is to develop a highly reliable and easily to fabricate current sensor.

A current sensor according to the invention comprises
a housing,
a first leadframe portion forming a current conductor having a first portion, a measuring portion and a second portion, the first portion including one or more first electrical terminals and the second portion including one or more second electrical terminals,
second leadframe portions forming third electrical terminals, and
a semiconductor chip having an active surface and a backside, wherein
the semiconductor chip has one or more magnetic field sensors disposed in or on the active surface,
the semiconductor chip is mounted on the first leadframe portion with the active surface facing the first leadframe portion,
the active surface of the semiconductor chip comprises first contacts,
the semiconductor chip comprises electrical through silicon connections disposed over and electrically connected to the first contacts,
the backside of the semiconductor chip comprises second contacts, each of the second contacts electrically connected to one of the electrical through silicon connections,
the second contacts are electrically connected to the third electrical terminals, and
a number of first contacts, through silicon connections and second contacts is at least three in order to provide electrical power and outputting an output signal responsive to the measured current.

The through silicon connections may be through silicon vias. The second contacts are preferably electrically connected to the third electrical terminals by wire bonds. The current sensor may further comprise one or more isolation layers disposed between the active surface of the semiconductor chip and the current conductor and at least partially covering the active surface. Preferably, at least one of the one or more isolation layers protrudes over two or more edges of the semiconductor chip. The one or more isolation layers may include a ceramics plate. The first and second terminals are disposed on two edges of the housing, preferably on three edges of the housing to minimize the ohmic resistance. The first contacts maybe covered by a passivation layer. A metallic layer maybe disposed between at least parts of the electronic circuitry and the current conductor, the metallic layer electrically connected to one of the first contacts.

A method of making a current sensor according to the invention comprises
providing a leadframe having a first leadframe portion, second leadframe portions and a frame connecting the first and second leadframe portions, the first leadframe portion forming a current conductor having a first portion, a measuring portion and a second portion, the first portion including one or more first electrical terminals and the second portion including one or more second electrical terminals, and the second leadframe portions forming third electrical terminals,
providing a semiconductor chip, the semiconductor chip comprising
one or more magnetic field sensors disposed in or on an active surface,
first contacts disposed on the active surface,
electrical through silicon connections disposed over and electrically connected to the first contacts,
second contacts disposed on a backside of the semiconductor chip, each of the second contacts electrically connected to one of the electrical through silicon connections, wherein the backside is disposed opposite to the active surface and wherein a number of the first contacts, through silicon connections and second contacts is at least three,
mounting the semiconductor chip on the first leadframe portion with the active surface facing the first leadframe portion,
making electrical connections between the second contacts and the third electrical terminals,
making a housing, and
cutting off the frame of the leadframe.

Preferably the making of electrical connections between the second contacts and the third electrical terminals is making wire bonds between the second contacts and the third electrical terminals.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
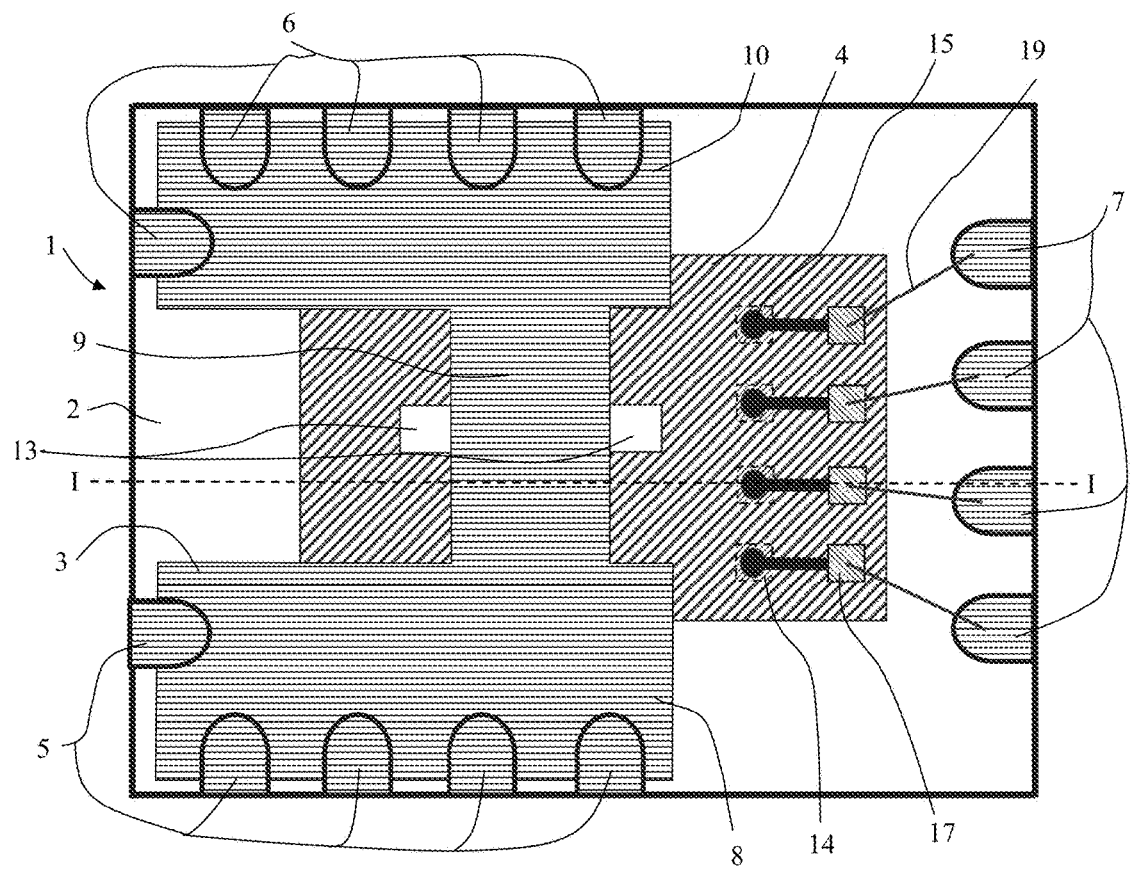
FIG. 1 shows a top view to the bottom side of a current sensor according to the invention.
Figure 2:
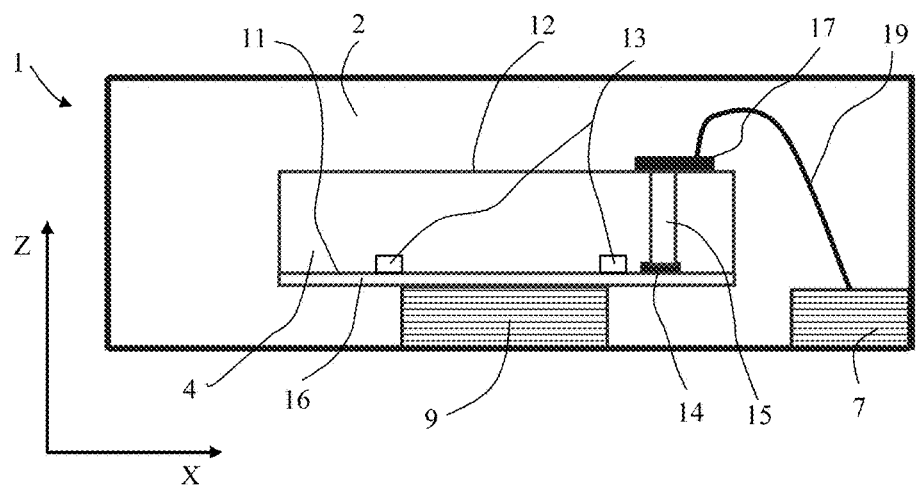
FIG. 2 shows a cross-section of the current sensor, FIG. 3, 4 show top views to the bottom side of further embodiments of the current sensor according to the invention.

FIGS. 1 and 2 illustrate an embodiment of a current sensor 1 according to the invention. FIG. 1 shows a view to the bottom side of the current sensor 1 and FIG. 2 shows a cross-section along the line I-I of FIG. 1. In FIG. 1 many elements are shown as if they were transparent. The current sensor 1 comprises a housing 2 of plastic, a current conductor 3, a semiconductor chip 4 and one or more first electrical terminals 5, one or more second electrical terminals 6 and at least three third electrical terminals 7. The electrical terminals 5, 6 and 7 are disposed along the edges of the housing 2 and exposed to the outside of the housing 2. In this embodiment, the housing 2 is a so-called QFN package (Quad Flat No Leads Package). The current conductor 3 is formed of a first leadframe portion having a first portion 8, a measuring portion 9 and a second portion 10. The first portion 8 includes the one or more first electrical terminals 5, the second portion 10 includes the one or more second electrical terminals 6. The electrical terminals 5 and 6 are those portions of the first portion 8 and the second portion 10 of the leadframe which are exposed to the outside of the housing 2 and which are used to connect the current conductor 3 to an external (interrupted or not interrupted) current conductor of a printed circuit board or the like. The shape of each of the first and second electrical terminals 5 and 6 is indicated by a solid line. The one or more first electrical terminals 5 and the one or more second electrical terminals 6 are those parts of the current conductor 3 which are used to supply and discharge a current to be measured from and to the outside of the housing 2: in use, the current sensor 1 is mounted on a printed circuit board or the like and the current to be measured is supplied through the one or more first terminals 5, the first portion 8, the measuring portion 9, the second portion 10 and discharged through the one or more second terminals 6. The measuring portion 9 and adjacent portions of the first portion 8 and the second portion 10 may be encapsulated in the housing 2 or may be flush with the housing 2 and therefore be exposed to the outside of the housing 2. The third electrical terminals 7 are used to supply electrical power to the semiconductor chip 4 and to output at least one output signal responsive to the current flowing through the measuring portion 9. Additional third electrical terminals 7 may be provided to test and/or configure the electronic circuitry, for example for adjusting the sensitivity of the current sensor 1 in a calibration step. The first portion 8, the measuring portion 9, the second portion 10 and the terminals 5-7 are all made of the same material, i.e. a metallic leadframe, the frame of which is cut off at the end of the manufacturing process.

Figure 3:
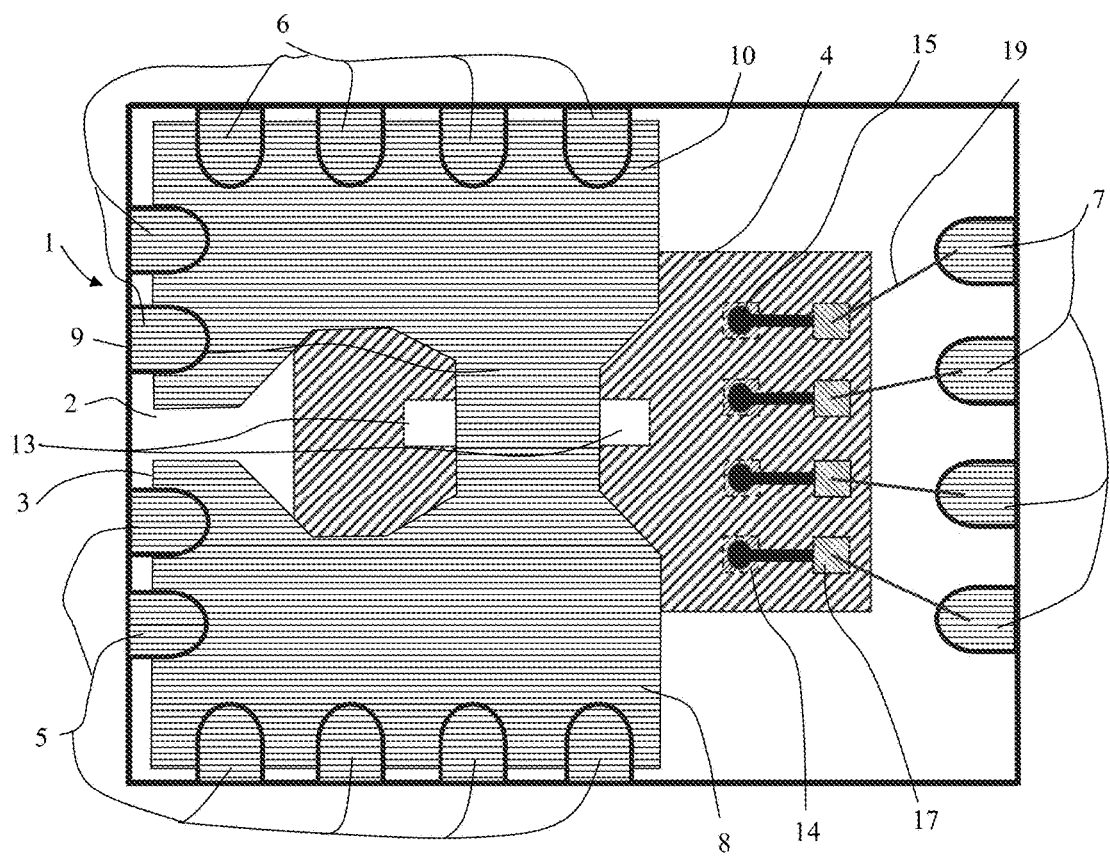
Figure 4:
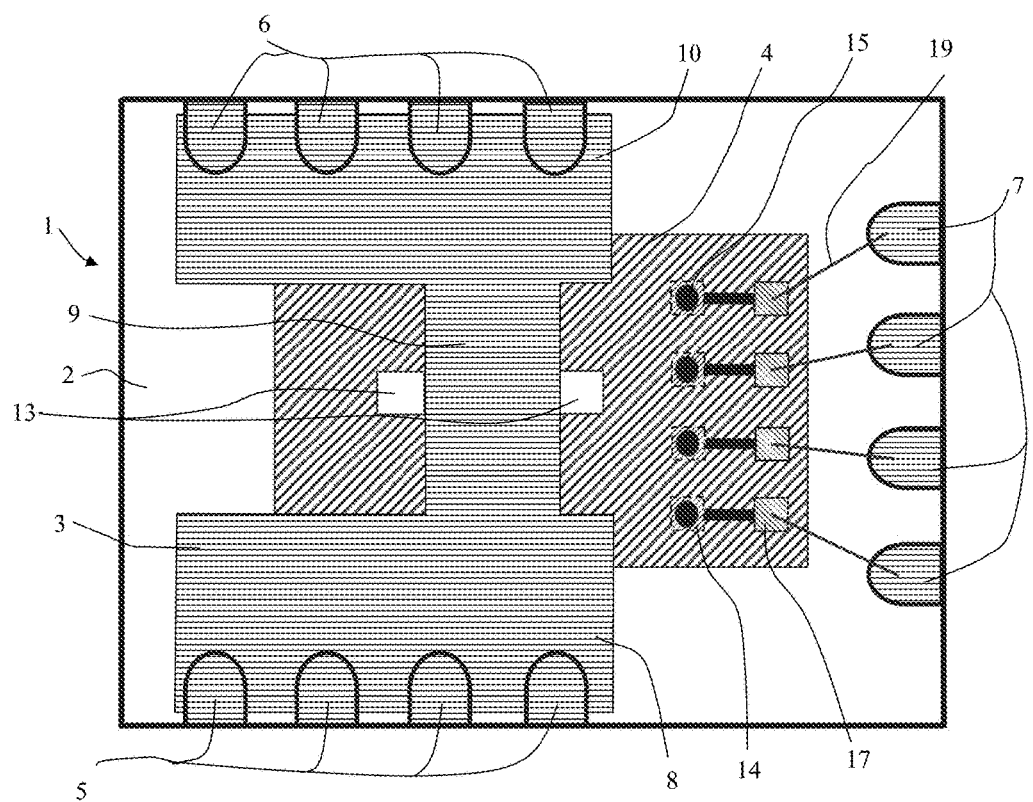

FIGS. 3 and 4 illustrate two further embodiments of a current sensor 1 according to the invention and show like FIG. 1 a view to the bottom side of the current sensor 1. The embodiments shown in FIGS. 1, 3 and 4 differ from each other in the number and placement of the first terminals 5 and the second terminals 6 and the layout of the current conductor 3. It is preferred to have as much of the first electrical terminals 5 and as much of the second electrical terminals 6 as possible, in order to reduce the ohmic resistance between the external current conductor and the current conductor 3. Therefore, it is preferred to have the first and second terminals disposed on three edges of the housing 2 as illustrated in FIGS. 1 and 3. In the embodiment shown in FIG. 4 the first electrical terminals 5 and the second electrical terminals 6 are disposed on two opposing sides of the housing 2. However, there may be, for certain applications, only one first electrical terminal 5 and only one second electrical terminal 6.

The semiconductor chip 4 has an active surface 11 and a backside 12 opposite to the active surface 11. The active surface 11 comprises one or more magnetic field sensors 13 and preferably also electronic circuitry for operating the one or more magnetic field sensors 13 and outputting at least one output signal. The one or more magnetic field sensors 13 are preferably sensitive to the component of the magnetic field produced by the current flowing through the measuring portion 9 that runs in the Z-direction and therefore placed adjacent the measuring portion 8 of the current conductor 3. The one or more magnetic field sensors 13 may alternatively be sensitive to the component of the magnetic field produced by the current flowing through the measuring portion 9 that runs in the X-direction and therefore arranged over the measuring portion 8 of the current conductor 3. The one or more magnetic field sensors 13 may be Hall effect sensors, AMR (Anisotropic Magneto Resistive) sensors, GMR sensors (Giant Magneto Resistive) and/or Hall effect sensors including magnetic field concentrators. The one or more magnetic field sensors 13 may be made in CMOS technology and as such disposed in the active surface 11, but alternatively they may be made in another technology using for example a GaAs substrate which is then disposed on the active surface 11 of the semiconductor chip 4.

The semiconductor chip 4 comprises a number of first contacts 14 disposed at the active surface 11, a same number of electrical through silicon connections, and a same number of second contacts 17 disposed at the backside 12. The second contacts 17 are also called redistributed contacts as a redistribution layer is normally used to make them and place them at the desired locations. In the present embodiment, the electrical through silicon connections are so-called TSV's 15 (Through Silicon Vias). The second contacts 17 are in the vicinity of the third electrical terminals 7. The electrical through silicon connections, here the TSV's 15, are disposed over the first contacts 14. The second contacts 17 are laterally displaced from the TSV's 15. The first contacts 14 are preferably made of or comprise Cu or Al. Al may be used in combination with Si and/or Cu, e.g. as an AlSiCu alloy or an AlCu alloy. The TSV's 15 comprise a number of different layers, for example a sidewall passivation layer, a barrier/adhesion layer, a seed layer and a metal layer. The barrier/adhesion layer may for example be a layer comprising Ti, e.g. a TiN layer, the seed layer may be a Cu layer and the metal layer may also be Cu, in particular electroplated Cu. Other combinations of layers are also possible, e.g. a barrier layer of TiW, a seed layer of W and a layer of Cu, or W or AlCu. The seed layer and the metal layer can also be used to form the second contacts 17. Alternatively, different conductive materials may be used for the TSV's 15 and the second contacts 17. A number of different methods can be used to deposit the conductive materials, among them electroplating, PVD (Physical Vapor Deposition), PE-CVD (Plasma Enhanced Chemical Vapor Deposition) and MOCVD (MetalOrganic Chemical Vapour Deposition). So, each of the first contacts 14 is electrically connected to one of the second contacts 17 via one of the TSV's 15 and a metal line. Therefore, the TSV's 15 provide electrical connections between the first contacts 14 disposed at the active surface 11 and the second contacts 17 disposed at the backside 12 of the semiconductor chip 4.

The semiconductor chip 4 is mounted on the current conductor 3 with the active surface 11 facing the current conductor 3. The second contacts 17 are electrically connected to the third electrical terminals 7, preferably by wire bonds 19.

To achieve a high dielectric strength, the semiconductor chip 4 preferably has one or more isolation layers 16 disposed on the active surface 11 which preferably completely cover the active surface 11, but at least partially cover the active surface 11, namely that part of the active surface 11 that lies directly above the current conductor 3. More preferably, at least one of the one or more isolation layers 16 protrudes over at least two of the edges of the semiconductor chip 4 by at least 0.4 mm. So the one or more isolation layers 16 provide a minimum isolation distance of 0.4 mm everywhere between the current conductor 3 and the semiconductor chip 4. The one or more isolation layers 16 may include a ceramic plate or a tape or a die attach film (DAF). Additionally, the minimum distance between any portion of the current conductor 3 and the third electrical terminals 7 is at least 4 mm, in some cases at least 7 mm.

Additionally or alternatively, a passivation layer, in particular a passivation layer made of silicon oxide or silicon nitride or polyimide may cover the first contacts 14, in order to provide high voltage isolation between the electronic circuitry and the current conductor 3.

Figure 5:
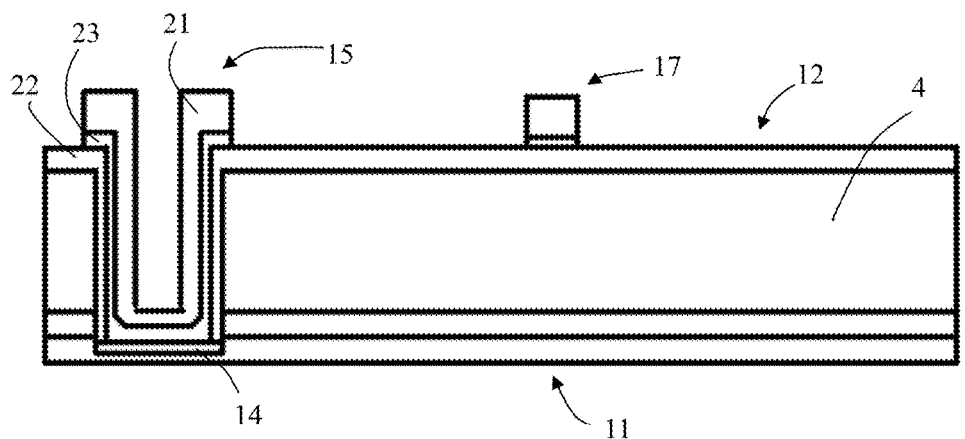
FIG. 5 shows a cross-section of a through silicon via (TSV)

FIG. 5 shows a cross-section of a TSV 15. The TSV 15 is a hole disposed over a first contact 14 and provided with an electrically conductive layer, e.g. a metal layer 21. The metal layer 21 makes an electrical connection between the first contact 14 and a second contact 17. The first contact 14 is on the active surface 11 while the second contact 17 is on the backside 12 of the semiconductor chip 4. The TSV 15 may have a circular cross-section with a diameter of typically about 50 micrometers, but may have any other suitable cross-section and/or size. The hole of the TSV 15 is made by an RIE (Reactive Ion Etching) process. Therefore, the sidewalls of the TSV 15 are substantially vertical walls. As described above, layers of different materials have been used to make the TSV 15, among them a sidewall passivation layer 22, an adhesion/barrier layer and a seed layer deposited on the adhesion/barrier layer, the two layers denoted by the reference numeral 23, and the metal layer 21.

In another embodiment, the housing may be a SOIC housing wherein the first, second and third electrical terminals 5-7 are leads protruding out of the housing 2.

The metal layer used to make the electrical connections between the second contacts 17 and the TSV's 15 may also at least partially cover the remaining area of the backside 12 to provide an electromagnetic shield.

Figure 6:
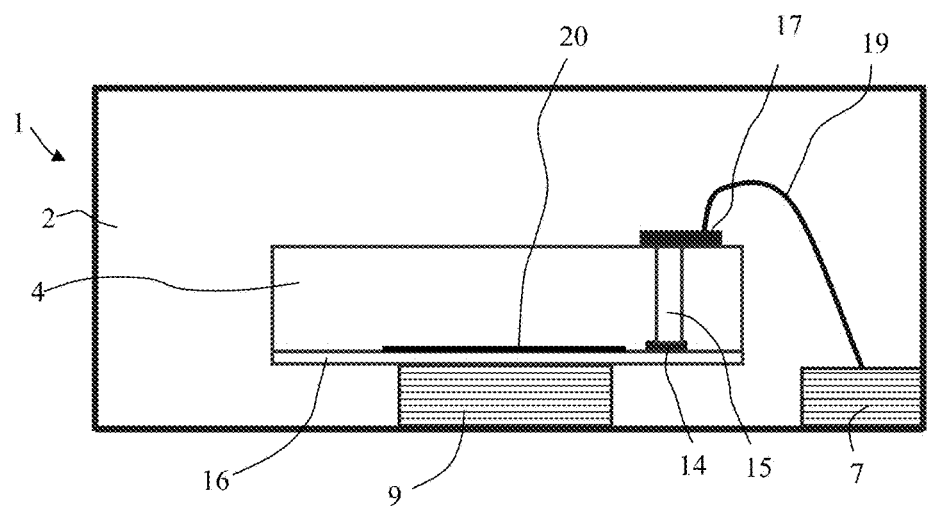
FIG. 6 shows a cross-section of a further embodiment of a current sensor according to the invention.

The active surface 11 of the semiconductor chip 4 comprises one or more structured metal layers to provide electrical connections between the electrical components including the magnetic field sensors. One of the metal layers may be disposed at least over the magnetic field sensors and/or some analog parts of the electronic circuitry and—in use—electrically connected to ground (GND) in order to reduce the capacitive coupling between the semiconductor chip 4 and the current conductor 3 and thus reduce or eliminate the effect of electromagnetic disturbances induced by the current conductor 3. Digital parts of the electronic circuitry may also be covered by this metal layer. Therefore, the metallic layer may be either connected to said one of the first contacts 14 which is connected via a corresponding TSV 15 to the third electrical terminal 7 used to supply the GND of the power supply to the electronic circuitry of the semiconductor chip 4, or connected to an additional first contact 14 disposed under an additional TSV 15 and thus connected to an additional second contact 17 which is connected by a wire bond to an additional third terminal 7 which is in use connected to GND. FIG. 6 shows a cross-section of an embodiment of a current sensor 1 with such a grounded metal layer 20.

The invention provides several advantages:

The first and second electrical terminals used to connect the current conductor to the outside may be arranged along three edges of the housing. There may be placed so many first and second electrical terminals as possible as each of these terminals reduces the ohmic resistance.

The active surface of the semiconductor chip is completely isolated from the current conductor thus providing high dieelectric strength.

The smallest distance between the current conductor and anyone of the third electrical terminals is relatively large adding to improve the dieelectric strength.

Cracks between the solder balls and the third electrical terminals often occurring when using the flip chip technology resulting from thermal variations drop off.

The wire bonding technology guarantees a high robustness of the current sensor against damages and this at low costs.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A current sensor, comprising
a housing,
a first leadframe portion forming a current conductor having a first portion, a measuring portion and a second portion, the first portion including one or more first electrical terminals and the second portion including one or more second electrical terminals,
second leadframe portions forming third electrical terminals, and
a semiconductor chip having an active surface and a backside,
wherein
the semiconductor chip has one or more magnetic field sensors disposed in or on the active surface,
the semiconductor chip is mounted on the first leadframe portion with the active surface facing the first leadframe portion,
the active surface of the semiconductor chip comprises first contacts,
the semiconductor chip comprises electrical through silicon connections disposed over and electrically connected to the first contacts,
the backside of the semiconductor chip comprises second contacts, each of the second contacts laterally displaced from and electrically connected to one of the electrical through silicon connections via a metal line,
the second contacts are electrically connected to the third electrical terminals, and
a number of first contacts, through silicon connections and second contacts is at least three.

2. The current sensor according to claim 1, wherein the through silicon connections are through silicon vias.

3. The current sensor according to claim 2, wherein the second contacts are electrically connected to the third electrical terminals by wire bonds.

4. The current sensor according to claim 3, wherein the first and second terminals are disposed on three edges of the housing.

5. The current sensor according to claim 2, wherein the first and second terminals are disposed on three edges of the housing.

6. The current sensor according to claim 1, wherein the second contacts are electrically connected to the third electrical terminals by wire bonds.

7. The current sensor according to claim 6, wherein the first and second terminals are disposed on three edges of the housing.

8. The current sensor according to claim 1, further comprising one or more isolation layers disposed between the active surface of the semiconductor chip and the current conductor and at least partially covering the active surface.

9. The current sensor according to claim 8, wherein at least one of the one or more isolation layers protrudes over two or more edges of the semiconductor chip.

10. The current sensor according to claim 8, wherein the one or more isolation layers include a ceramics plate.

11. The current sensor according to claim 1, wherein the first and second terminals are disposed on two edges of the housing.

12. The current sensor according to claim 1, wherein the first and second terminals are disposed on three edges of the housing.

13. The current sensor according to claim 1, wherein the first contacts are covered by a passivation layer.

14. The current sensor according to claim 1, wherein a metallic layer is disposed between at least parts of electronic circuitry disposed in the active surface and the current conductor, the metallic layer electrically connected to one of the first contacts.

* * * * *